(12) United States Patent
Tang (10) Patent No.: US 8,181,074 B2
(45) Date of Patent: May 15, 2012

(54) SOFT ERROR RECOVERABLE STORAGE ELEMENT AND SOFT ERROR PROTECTION TECHNIQUE

(75) Inventor: Bo Tang, Sunnyvale, CA (US)

(73) Assignee: Oracle America, Inc., Redwood City, CA (US)

( * ) Notice: Subject to any disclaimer, the term of this patent is extended or adjusted under 35 U.S.C. 154(b) by 1150 days.

(21) Appl. No.: 11/961,952

(22) Filed: Dec. 20, 2007

(65) Prior Publication Data
US 2009/0164834 A1 Jun. 25, 2009

(51) Int. Cl.
*H03K 19/003* (2006.01)
(52) U.S. Cl. ........... 714/746; 326/13; 327/208; 327/212
(58) Field of Classification Search .................. 326/13; 327/208, 212; 714/746
See application file for complete search history.

(56) References Cited

U.S. PATENT DOCUMENTS

| | | | |
|---|---|---|---|
| 7,023,235 B2 * | 4/2006 | Hoff | 326/10 |
| 7,474,116 B2 * | 1/2009 | Uemura et al. | 326/9 |
| 7,613,067 B2 * | 11/2009 | Sachdev et al. | 365/230.06 |
| 7,923,762 B2 * | 4/2011 | Nagaoka | 257/288 |
| 2007/0133261 A1 * | 6/2007 | Tsuruta et al. | 365/154 |

OTHER PUBLICATIONS

Author Unknown, "Soft Error", Wikipedia, http://en.wikipedia.org/wiki/Soft_error, 6 pages, at least as early as Aug. 3, 2007.
Heijmen et al., "A Comparative Study on the Soft-Error Rate of Flip-Flops from 90-nm Production Libraries", IEEE, 44th Annual International Reliability Physics Symposium, San Jose, California, pp. 204-211, 2006.
Mitra et al., "Robust System Design with Built-In Soft-Error Resilience", IEEE, pp. 43-52, Feb. 2005.

* cited by examiner

*Primary Examiner* — Stephen Baker
(74) *Attorney, Agent, or Firm* — Polsinelli Shughart PC (57) ABSTRACT

A soft error recoverable storage element suitable for use in latches, flip-flops, static ram memory cells and microprocessor pipeline stages. The storage element employs a redundant copy of the stored data value and a feedback loop. One embodiment employs an interlocking four inverter loop with gating devices that blocks the propagation of a soft error induced change of state and causes the storage element to recover its original stored data state.

14 Claims, 7 Drawing Sheets

FIG.1

(PRIOR ART)

FIG.2

(PRIOR ART)

FIG.3

(PRIOR ART)

FIG.8

SOFT ERROR RECOVERABLE STORAGE ELEMENT AND SOFT ERROR PROTECTION TECHNIQUE

FIELD OF THE INVENTION

The present invention relates to integrated circuits. In particular, the present invention relates to high performance flip-flops with a soft error recoverable storage element.

BACKGROUND

Soft errors involve changes to data, rather than changes to a physical circuit. A soft error, unlike many other errors, may be recoverable, for example, by rewriting the data. Soft errors may occur on transmission lines, in digital logic, in analog circuits, semiconductor storage elements and elsewhere. Oftentimes, soft errors are caused by neutrons from cosmic rays and alpha particles emitted from integrated circuit packaging material (soft error sources), although other causes are also possible.

Soft errors may be caused by package radioactive decay that results in the emission of an alpha particle. Soft errors may also be caused by neutrons. A neutron may undergo neutron capture by a nucleus of an atom, producing an unstable isotope that in turn may cause a soft error when the isotope decays producing an alpha particle.

A soft error may occur when an alpha particle hits a transistor device, transferring a charge to a sensitive node of the device that alters a data value stored in the device. A soft error may result in improper operation. For example, a soft error may alter the program code stored in the memory of a microprocessor resulting in improper microprocessor operation. Such an error may be referred to as a soft error because the affected program code may be rewritten to restore proper microprocessor operation.

A circuit may be prone to soft errors when its critical charge value, the minimum electron charge disturbance needed to flip its logic state, becomes too low. A circuit's critical charge value may be a function of capacitance and voltage. A circuit with a higher critical charge value may result in less sensitivity to soft errors, but also may result in a slower device having higher power dissipation. As device geometries continue to shrink and supply voltages continue to decrease for performance reasons, devices may become more prone to soft errors.

Soft errors may be a serious issue for memory cells because their critical charges may be very small. Error correcting codes may be implemented in memory modules to reduce soft errors. As integrated circuit processes continue to shrink feature sizes, the critical charge for logic circuits, such as static combinational logic and sequential elements, may become small enough to be less than the charges generated by alpha particles. In microprocessors, network processors and network storage controllers, the overall soft error rate for a state of the art design may be on the order of 40% for unprotected SRAM, 11% for combinational logic and 49% for sequential elements. Because the soft error rate of sequential elements, such as latches and flip-flops, may exceed that of unprotected SRAMs, sequential elements with reduced soft error rates may be needed.

Figure 1:
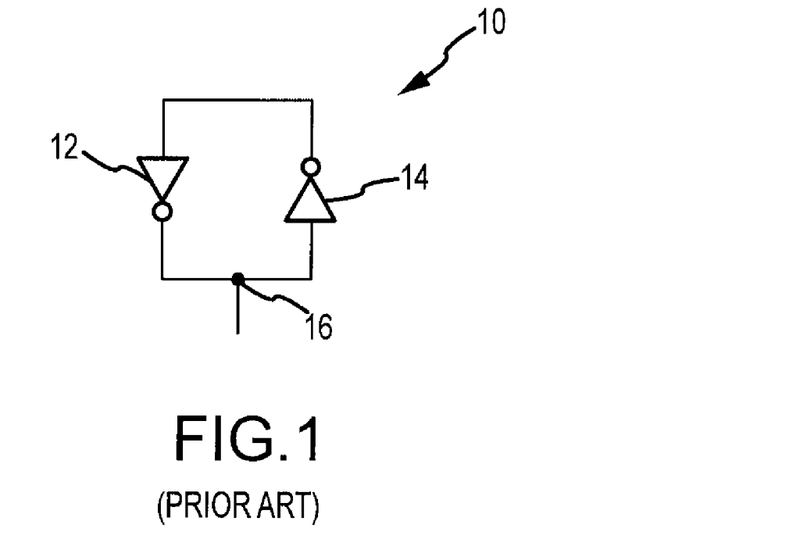
FIG. 1 (prior art) depicts storage element with back to back inverters.
Figure 2:
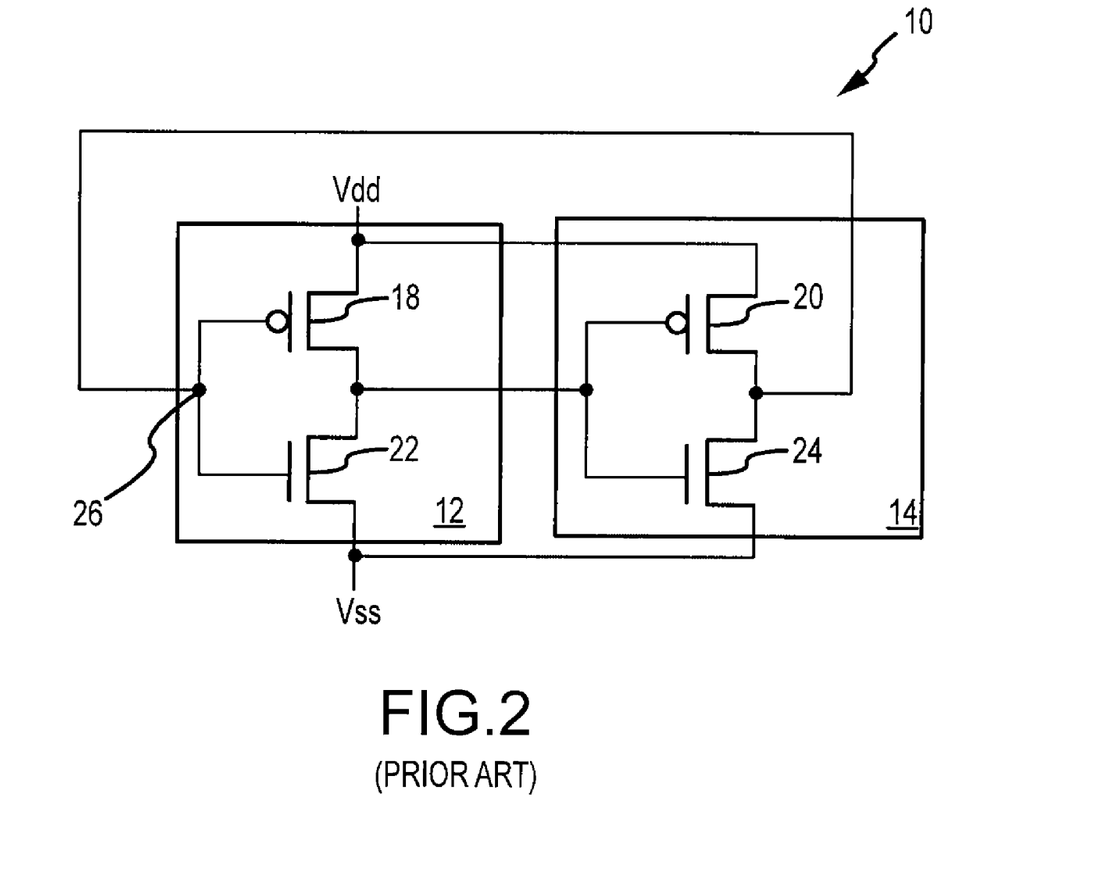
FIG. 2 (prior art) depicts a conventional CMOS implementation of the storage element of FIG. 1.

FIG. 1 depicts a storage element 10 employing a conventional configuration of back-to-back inverters 12, 14 as a storage node in a sequential element such as a latch or flip-flop, also sometimes referred to as a "keeper." The inverters 12, 14 may maintain the voltage level on a storage node 16. FIG. 2 depicts a conventional CMOS implementation of the storage element 10 of FIG. 1. Each inverter 12, 14 may include a PMOS transistor 18, 20, respectively, and an NMOS transistor 22, 24, respectively. Node 26 may initially be in a logic one state with the NMOS transistor 22 on and the PMOS transistor 18 off. An alpha particle hitting the node 26 around the active region of NMOS transistor 24 may drain the charge stored on the node 26 to a supply node Vss, causing the node 26 to flip to the opposite logic state, a logic zero. This causes the NMOS transistor 22 to turn off and PMOS transistor 18 to turn on, flipping the logic state of the following output node from a logic zero to a logic one. Thus, the stored data in the storage element 10 is altered by the alpha particle hit. This change of logic state is a soft error.

The node 26 may also be in a logic zero state with the PMOS transistor 18 on and the NMOS transistor 22 off. An alpha particle hitting the node 26 around the active region of PMOS transistor 20 can source the charge from a supply node vdd to the node 26 and cause the node to flip from a logic zero to a logic one. This causes the NMOS transistor 22 to turn on and the PMOS transistor 18 to turn off, flipping the logic state of the following output node from a logic one to a logic zero. Thus, the stored data in the storage element 10 is altered by the alpha particle hit.

Figure 3:
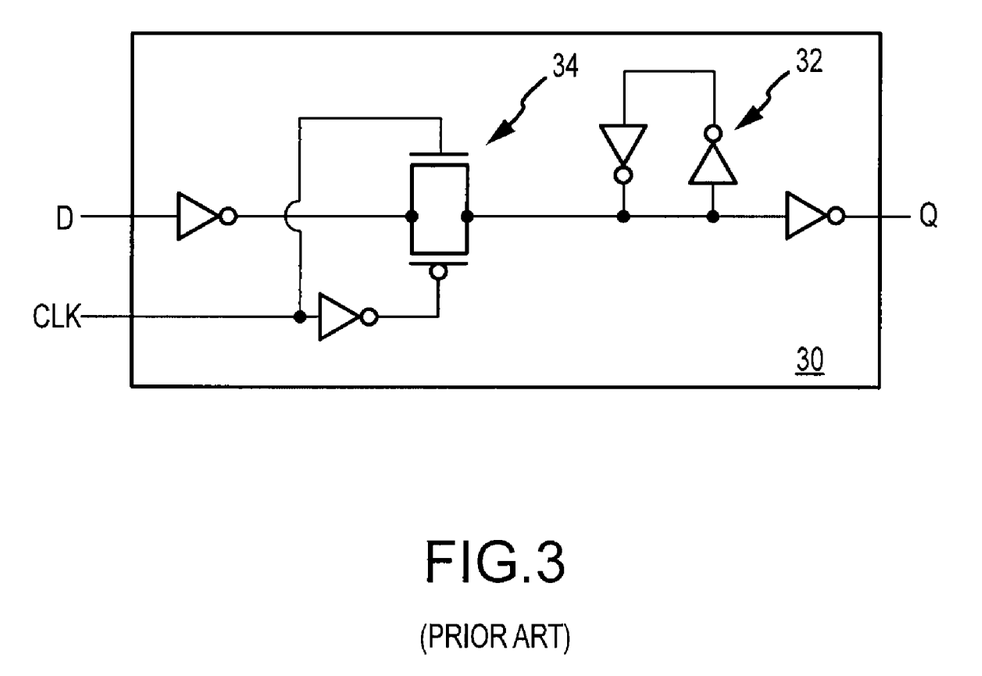
FIG. 3 (prior art) depicts a latch employing the storage element of FIG. 1.

FIG. 3 depicts a latch 30 employing a keeper-type storage element 32, which may be implemented by back-to-back inverters, for example. When a clock CLK is at a logic one, a transmission gate 34 of the latch 30 may become transparent. While the transmission gate 34 is transparent, the upstream combinational logic may drive the D input of the latch 30 and may write the corresponding logic value into the storage element 32. During this time, any soft error that affects the transistors inside the latch 30 may have a negligible effect because the correct logic value is being driven at the D input of the latch. However, when the clock input of the latch 30 is at a logic zero, i.e., when the latch is holding a logic state, a soft error may flip the latch state. Thus, the latch 30 may be more susceptible to soft errors when the storage element 32 of the latch is holding a logic state.

As technology trends continue toward increasingly smaller feature sizes, system level soft errors may become more frequent and may become an issue, for example, for enterprise servers and networking hardware. Current soft error protection techniques may include circuit-level hardening, classical hardware redundancy, and time redundancy techniques. However, such techniques may introduce additional latency. Certain high performance circuits may not be able to tolerate the additional latency introduced by these soft error protection techniques.

What is needed is a storage node that recovers from soft errors without adversely affecting latency. Such a storage node may be employed in sequential storage elements such as latches and flip-flops and memory cells to minimize the effects of soft errors on circuit operation and/or stored memory state.

SUMMARY

One aspect of the present invention involves a storage element configured to recover from a soft error. The storage element includes a plurality of inverting elements configured in a loop. The storage element further includes a plurality of gating elements operably coupled to the plurality of inverters. Each gating element includes a control node operably coupled to the output of the next inverter in the loop. When a gating element's control node is at a logic zero value, the corresponding inverting element is unable to drive its output to a logic zero state.

Another aspect of the present invention involves a storage element configured to recover from a soft error. The storage element includes a first plurality of storage nodes and a feedback circuit configured to prevent a soft error induced change in the data value stored in one of the storage nodes from propagating to another storage node. The storage element is capable of recovering from the soft error induced change in data value.

Yet another aspect of the present invention involves a storage element configured to recover from a soft error. The storage element includes four inverters and four gating devices. Each inverter includes a switching element operable to drive the inverter output to a logic zero when the inverter input is a logic one and another switching element operable to driver the inverter output to a logic one when the inverter input is a logic zero. A gating device is operably coupled to an inverter and includes a control node operably coupled to the output node of the next inverter in the loop. The gating device prevents the inverter from driving its output node to a logic zero value when the control node is at a logic zero value.

DETAILED DESCRIPTION OF EMBODIMENTS OF THE INVENTION

One aspect of the present invention involves a storage element that may recover from individual soft errors due to alpha particle and/or neutron hits. The storage element may include a redundant copy of the data value and a feedback loop to allow the storage element to recover from the soft error. Another aspect of the present invention involves a soft error recoverable storage element that may be employed in a high performance latch or flip-flop. The storage element provides minimal added loading on the D and clock inputs of the latch or flip-flop.

Figure 4:
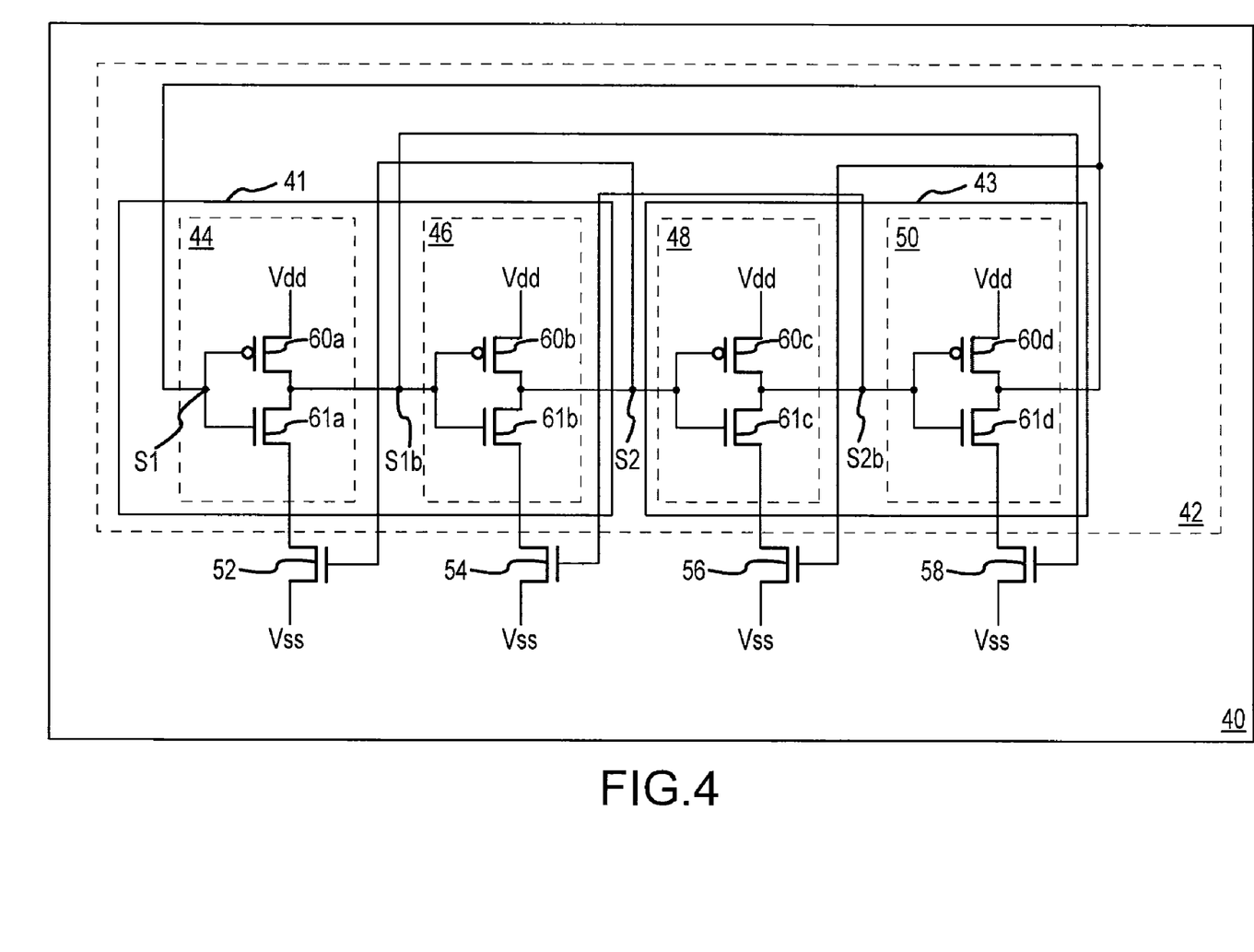
FIG. 4 depicts a circuit diagram of an embodiment of a soft error recoverable storage element.

More particularly, one aspect of the present invention may involve a soft error recoverable storage element that may be used as a storage element in a latch or memory cell to provide soft error recovery. Rather than using two back-to-back inverters, an interlocking four inverter loop 42 may be employed as a soft error recoverable storage element 40, as depicted in FIG. 4. A logic state may be stored in the nodes S1, S2, S1b and S2b (note that S1b and S2b store the complementary values of S1 and S2, respectively). Internal feedback circuitry including gating elements 52, 54, 56, 58 enable the storage element 40 to recover from a soft error.

Each inverter 44, 46, 48, 50 of the storage element 40 may include a respective PMOS transistor 60a, 60b, 60c, 60d and a respective NMOS transistor 61a, 61b, 61c, 61d. The NMOS transistors 61a, 61b, 61c, 61d may be gated by respective transistors 52, 54, 56, 58 controlled by respective nodes S2, S2b, S1, S1b. During normal operation, nodes S1 and S2 generally are at the same logic state and nodes S1b and S2b generally are at the same logic state. In this and other figures, a suffix b on a signal name stands for bar, meaning that the signal is inverted.

The configuration of inverters forms an inter-locking inverter loop 42 that may be referred to as a half gater storage element because only the NMOS transistors 61a-d of the inverters 44, 46, 48 50 are gated. An alpha particle hit may cause a glitch in logic state on one node of the storage element, but the glitch may not be propagated through the entire chain of inverters 44, 46, 48, 50. The affected node eventually recovers to the original logic state through feedback paths within the inverter loop 42, as described further below. It should be understood that various embodiments, such as shown, may only gate the NMOS transistor of each inverter.

Inverter 44 may include a PMOS transistor 60a and a NMOS transistor 61a. The source of the PMOS transistor 60a is connected to supply node Vdd. The gate of PMOS transistor 60a is connected to the gate of the NMOS transistor 61a which in turn is connected to input node S1, which is the input of inverter 44. The drain of the PMOS transistor 60a is connected to the drain of the NMOS transistor 61a which in turn is connected to node S1b. The source of the NMOS transistor 61a is connected to the drain of the NMOS transistor 52. The source of the NMOS transistor 52 is connected to a power node Vss. The gate of NMOS transistor 52 is connected to node S2.

Inverter 46 may include a PMOS transistor 60b and a NMOS transistor 61b. The source of the PMOS transistor 60b is connected to supply node Vdd. The gate of PMOS transistor 60b is connected to the gate of the NMOS transistor 61b which in turn is connected to node S1b, which is the input of inverter 46. The drain of the PMOS transistor 60b is connected to the drain of the NMOS transistor 61b which in turn is connected to node S2. The source of the NMOS transistor 61b is connected to the drain of the NMOS transistor 54. The source of the NMOS transistor 54 is connected to a power node Vss. The gate of NMOS transistor 54 is connected to node S2b.

Inverter 48 may include a PMOS transistor 60c and a NMOS transistor 61c. The source of the PMOS transistor 60c is connected to supply node Vdd. The gate of PMOS transistor 60c is connected to the gate of the NMOS transistor 61c which in turn is connected to node S2, which is the input of inverter 48. The drain of the PMOS transistor 60c is connected to the drain of the NMOS transistor 61c which in turn is connected to node S2b. The source of the NMOS transistor 61c is connected to the drain of the NMOS transistor 56. The source of the NMOS transistor 56 is connected to a power node Vss. The gate of NMOS transistor 56 is connected to node S1.

Inverter 50 may include a PMOS transistor 60d and a NMOS transistor 61d. The source of the PMOS transistor 60d is connected to supply node Vdd. The gate of PMOS transistor 60d is connected to the gate of the NMOS transistor 61d which in turn is connected to node S2b, which is the input of inverter 50. The drain of the PMOS transistor 60d is connected to the drain of the NMOS transistor 61d which in turn is connected to node S1. The source of the NMOS transistor 61d is connected to the drain of the NMOS transistor 58. The source of the NMOS transistor 58 is connected to a power node Vss. The gate of NMOS transistor 58 is connected to node S1b.

When a soft error occurs at a node of the inverter loop, that node may be in one of two possible states: a logic one state or a logic zero state. If the node is in a logic one state, the alpha particle causes the node to lose charge and transition to a logic zero state. This logic zero will propagate to the next node through the corresponding PMOS device of that node's inverter which is not gated by the feedback circuit. The PMOS device may drive that node to a logic one. However, the soft error does not propagate further because the NMOS device of that node is gated by the feedback circuit and prevents a change in state. The remaining two nodes of the storage element retain the original stored data. Because the alpha particle hit does not change the state of the whole inverter loop, the loop drives the two changed nodes back to their original stored data states.

If the node is in a logic zero state when the alpha particle hit occurs, the node may be charged to a logic one state. This change in data state may not be propagated to the next node in the loop because the NMOS device of the next inverter in the loop is gated by the feedback circuit. Thus, the other three nodes of the inverter loop retain their original data states. The loop drives the changed node back to its original stored data state. In either case, a soft error may flip the state in one or two nodes of the loop but does not flip the states of the entire loop. The loop recovers its original data state to maintain the correct stored data value. The operation of the interconnected loop will now be described in more detail.

The NMOS transistors 61*a*, 61*b*, 61*c*, 61*d* of the inverters 44, 46, 48, 50, may be gated by four gating transistors 52, 54, 56, 58, respectively. Initially, node S1 may be in a logic zero state with node S1*b* being in a logic one state, node S2 being in a logic zero state and node S2*b* being in a logic one state. An alpha particle hit to inverter 44 may cause its output to temporarily transition to a logic zero state. This may in turn result in the inverter 46 propagating the glitch because PMOS transistor 60*b* turns on pulling the output of inverter 46 to a logic one. However, the glitch may not be propagated to the output of inverter 48. The gate of transistor 56 is at a logic zero because it is connected to the output of inverter 50. Thus, gating transistor 56, for inverter 48, is opaque. As a result, transistor 61*c* is blocked from pulling the output of the inverter 48 to a logic zero. The output of inverter 50 (at a logic zero state) is connected to the input of inverter 44. This feedback results in the output of inverter 44 recovering to its original logic one output state.

The alpha particle may instead hit the inverter 46 causing its output to temporarily transition to a logic one state. However, the gating transistor 56, connected in series with the NMOS transistor 61*c* of the inverter 48, is opaque because its gate is connected to the output of inverter 50 (which is at a logic zero state). As a result, the NMOS transistor 61*c* is blocked from driving the output of the inverter 48 to a logic zero state. The outputs of inverters 48, 50, 44 retain their original stored data values of one, zero, one, respectively. The inverter loop, thus results in the output of inverter 46 recovering to its original logic zero state.

The 12 transistor half gater storage element 40 may provide soft error recovery from an alpha particle hit on any one of the four nodes S1, S1*b*, S2, S2*b* of the storage element. The storage element 40 may have a 50% chance of soft error recovery when two adjacent nodes of the storage element are simultaneously altered. For example, if node S1 is at a logic one and node S1*b* is at a logic zero state, simultaneous alpha particle hits may flip S1 from a logic one to a logic zero and S1*b* from a logic zero to a logic one. Because node S2 is gated by S2*b*, still at a logic zero, the error propagation may end at node S1*b*. Eventually the original node states may be recovered.

The duplication of logic states within the four inverter loop generally provides soft error recovery from a single alpha particle hit to any node of the half gater storage element. The half gater storage element for an exemplary embodiment has twelve transistors. While a stored logic state may be temporarily lost by one or two inverters, the remaining inverters cause the impacted inverter(s) to recover their original logic states. That is, an alpha particle hit to a node of the storage element does not result in a change in stored logic state.

Because the transistor pairs 61*a* and 52, 61*b* and 54, 61*c* and 56, 61*d* and 58 may each form an NMOS stack, the impact on chip area is generally small. For example, technology allowed minimum device sizes for the NMOS transistors and the PMOS transistors to maintain a beta-ratio of 2 may be employed in the 12 transistor storage element design. Such a design may achieve a total transistor sizing that is about double the normal back-to-back inverter storage element, even though the transistor count increases from 4 to 12. For example, if the minimum transistor size allowed in a particular technology is 0.2 um (e.g., the minimum transistor gate width is 0.2 um) and a beta ratio of 2 between PMOS and NMOS transistors is desired, for a typical back to back inverter storage element, each PMOS transistor will be 0.4 um and the total transistor size of this storage element will be (0.4 um+0.2 um)×2=1.2 um. For the interlocking four inverter loop storage element, the two NMOS transistors are stacked reducing their effective strength to half. This allows the use of the minimum size for PMOS transistors for a beta ratio of 2. Thus, all PMOS and NMOS transistors can be 0.2 um and the total transistor size of the new storage element will be (0.2+0.2+0.2)×4=2.4 um.

Figure 5:
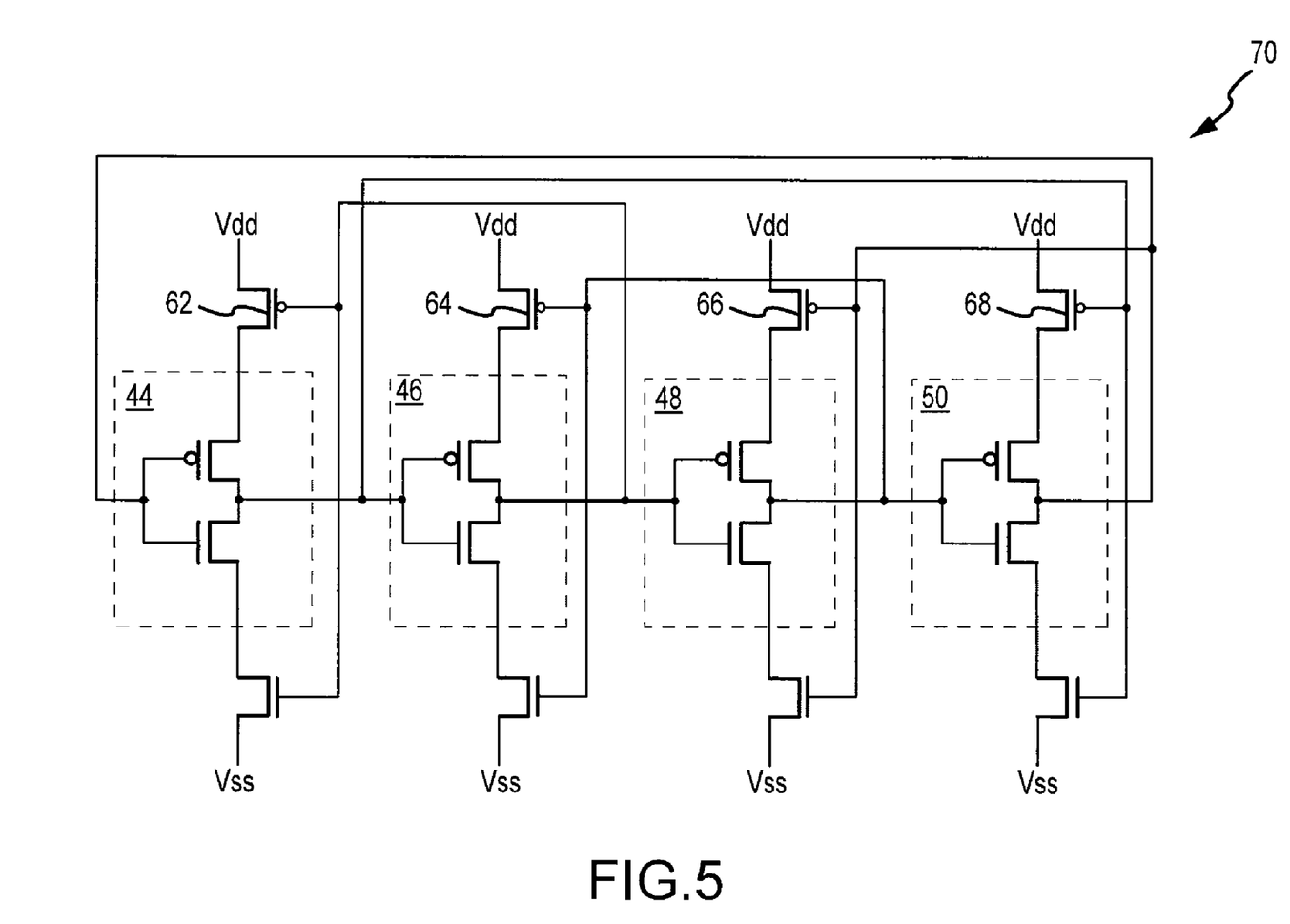
FIG. 5 depicts a circuit diagram of a second embodiment of a soft error recoverable storage element.

Another exemplary embodiment may include four gating PMOS transistors 62, 64, 66, 68 in series with the PMOS transistors of the inverters 44, 46, 48, 50 to gate those transistors, as depicted in FIG. 5. The source of each inverter PMOS transistor is connected to a drain of a respective gating transistor 62, 64, 66, 68, rather than being connected to supply node Vdd. The gate of each PMOS transistor 62, 64, 66, 68 is connected to the corresponding gate of NMOS transistors 52, 54, 56, 58. These four gating PMOS transistors may provide added protection from alpha particle hits by interrupting the error propagation through the inverter loop. A PMOS transistor gated by an opaque gating transistor is blocked from driving the output of its inverter to a logic one state.

The circuit depicted in FIG. 5 may be referred to as a full gater storage element 70. The full gater storage element 70 may have a faster recovery time from a single alpha particle hit and be more resistant to two alpha particle hits as described below.

If two alpha particles hit two adjacent nodes and cause state changes on both adjacent nodes, such changes will not be able to flip the entire interlocking inverter loop because the full gaters, driven by the other two unaltered nodes, prevent the state changes from propagating through the entire inverter loop. As such, the chance of storage elements employing the interlocking inverter loop surviving two concurrent alpha hits is typically increased.

Figure 6:
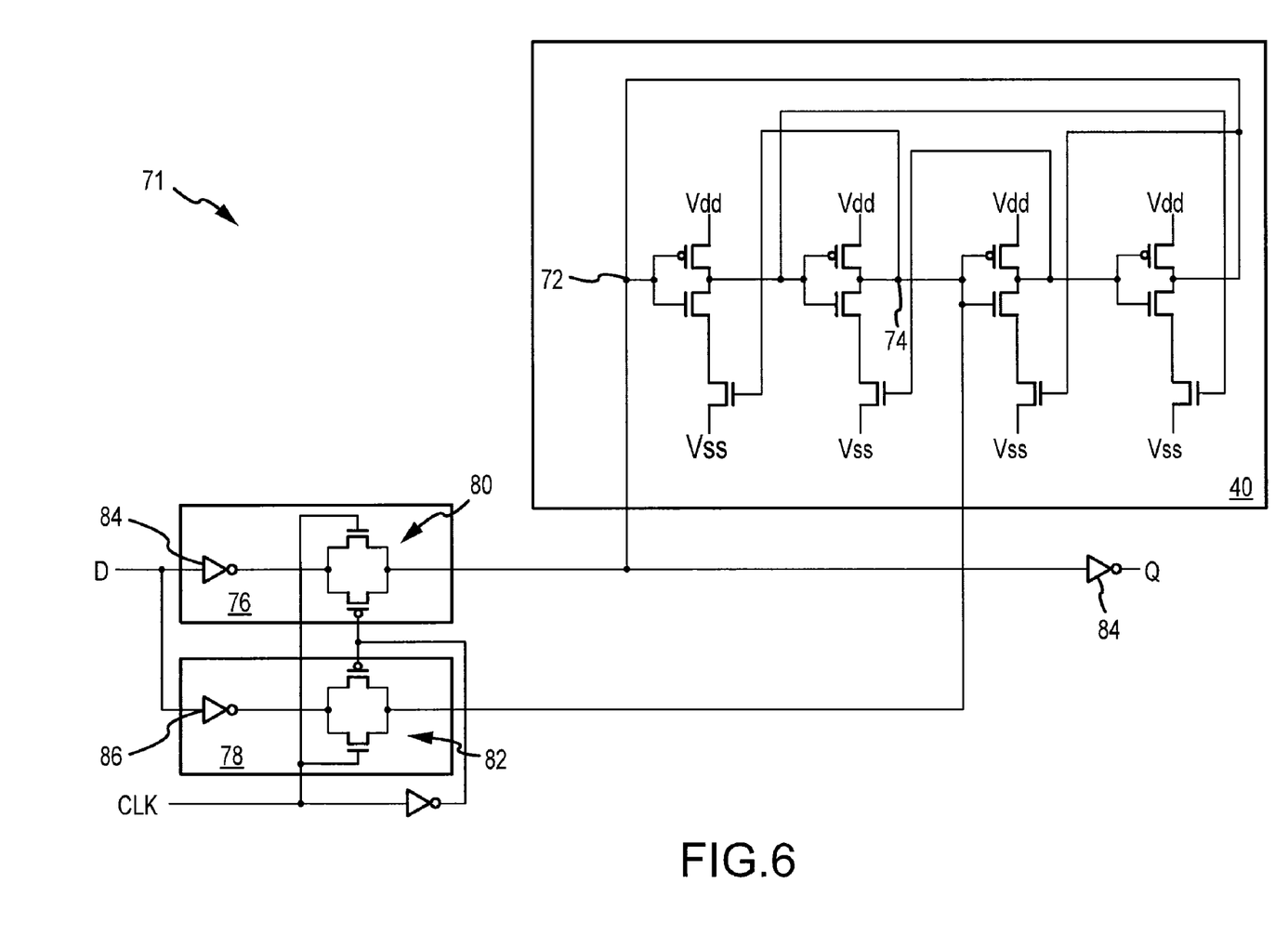
FIG. 6 depicts a circuit diagram of a latch employing the soft error recoverable storage element of FIG. 4.

FIG. 6 depicts a soft error recoverable latch 71 that employs the twelve transistor half gater storage element 40 of FIG. 4. Redundant clock circuitry is used to write a data value to a set of nodes of storage element 40 having the same logic state. For example, the write may update the two nodes 72, 74 of the storage element that store the same logic value. That is, a duplicate write may be performed to a second node 74 of the storage element storing the same data value as node 72. Various embodiments may employ two single-ended write circuits 76, 78 to update the storage element with the data value on a D input of the latch 71. Each single ended write circuit 76, 78 may employ an inverter 84, 86, respectively, and a transmission gate 80, 82, respectively, that may cause the latch 71 to become transparent when the clock CLK is active. This dual write circuit may be referred to as a single-ended duplicate write driver.

When the clock CLK is active, the transmission gates 80, 82 become transparent. Inverters 84, 86 may write an inverted data value into nodes 72, 74, respectively, of the storage element 40. When the clock is inactive, the transmission gates 80, 82 become opaque and the storage element 40 may hold the inverted data value. An inverter 84 may be used to provide a Q output for the latch 71.

Figure 7:
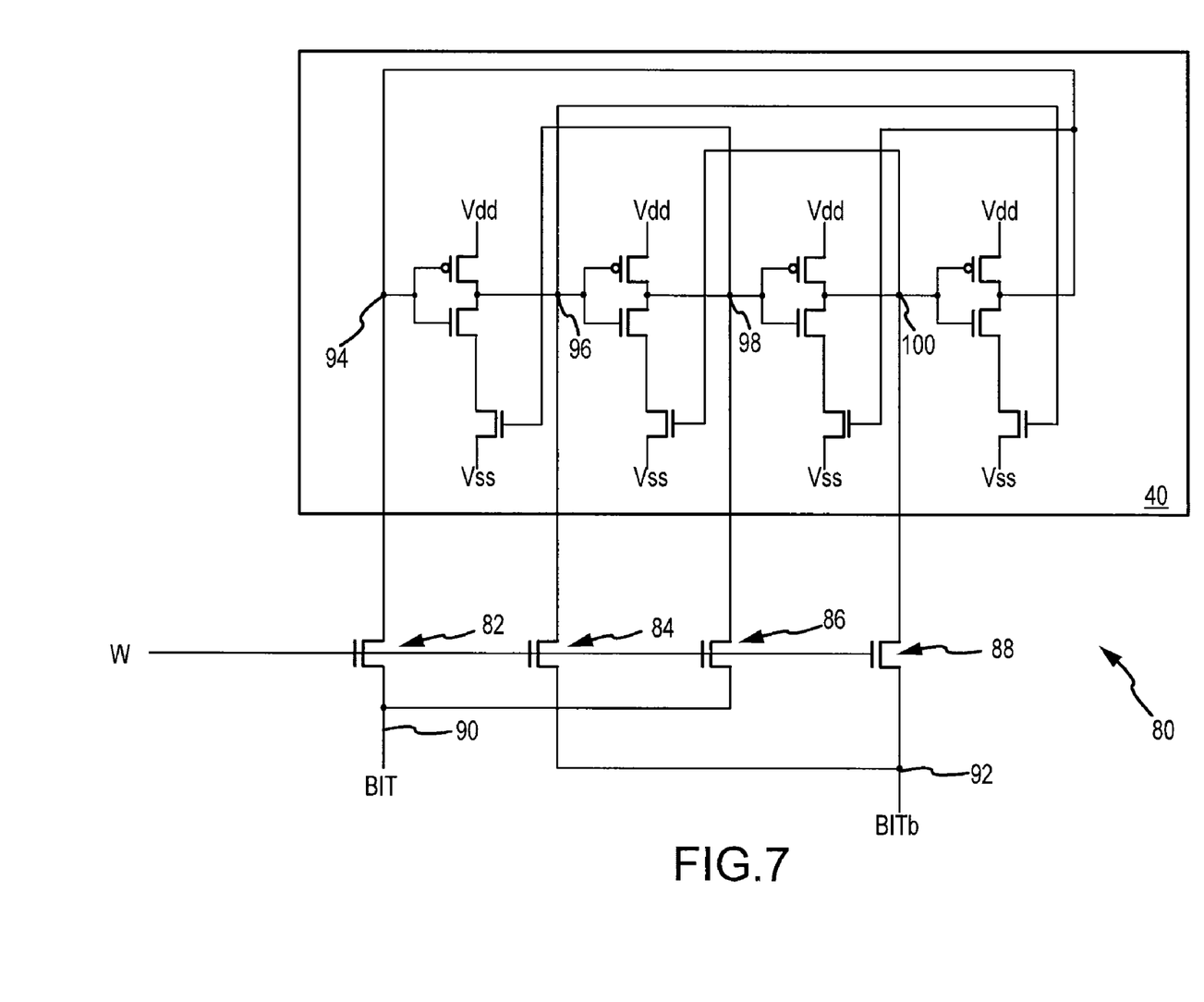
FIG. 7 depicts a circuit diagram of a memory cell employing the soft error recoverable storage element of FIG. 4.

Other embodiments may employ two push-pull drivers for the write circuitry. This may be referred to as a push-pull differential write driver and may be used in a soft-error recoverable static random access memory (SRAM) device. FIG. 7 depicts a memory cell 80 employing a soft error recoverable half gater storage element 40 with the push-pull differential write driver. Such a circuit may be employed in a high performance cache. When the write line W is enabled, transistors 82, 84, 86, 88 may become transparent causing a data value on the BIT line 90 to be written to nodes 94, 98 of the storage element 40 and the inverse of the data value on the BITb line 92 to be written to nodes 96, 100 of the storage element 40. This cell design 80, employing the half gater storage element 40, may include 16 transistors. It should be understood that a full gater storage element may used in the cell design, increasing the transistor count to 20 transistors.

A logic one to a logic zero flip on a node of the half gater storage element 40 may result in a longer recovery time than for a logic zero to a logic one flip. Typically, two nodes have to recover from the propagation of the logic one to logic zero transition versus only one node having to recover from the propagation of a logic zero to a logic one transition.

The above memory cell may be employed in a high performance cache, for example, when an increase in cell area may be a good tradeoff to achieve higher circuit performance. Traditional approaches to handling soft errors such as error correcting codes (ECC) may not be appropriate given the potential performance hit caused by the ECC circuitry. ECC logic typically adds more latency and results in a memory read operation taking a longer time.

The soft error recoverable storage element 40 may have minimal impact to circuit performance as compared to prior art approaches to soft-error hardening employing extra evaluation logic that may affect timing margins. The storage element 40 may present an additional capacitive load on the D input of the latch 71 due to the additional input capacitance of inverter 86.

Figure 8:
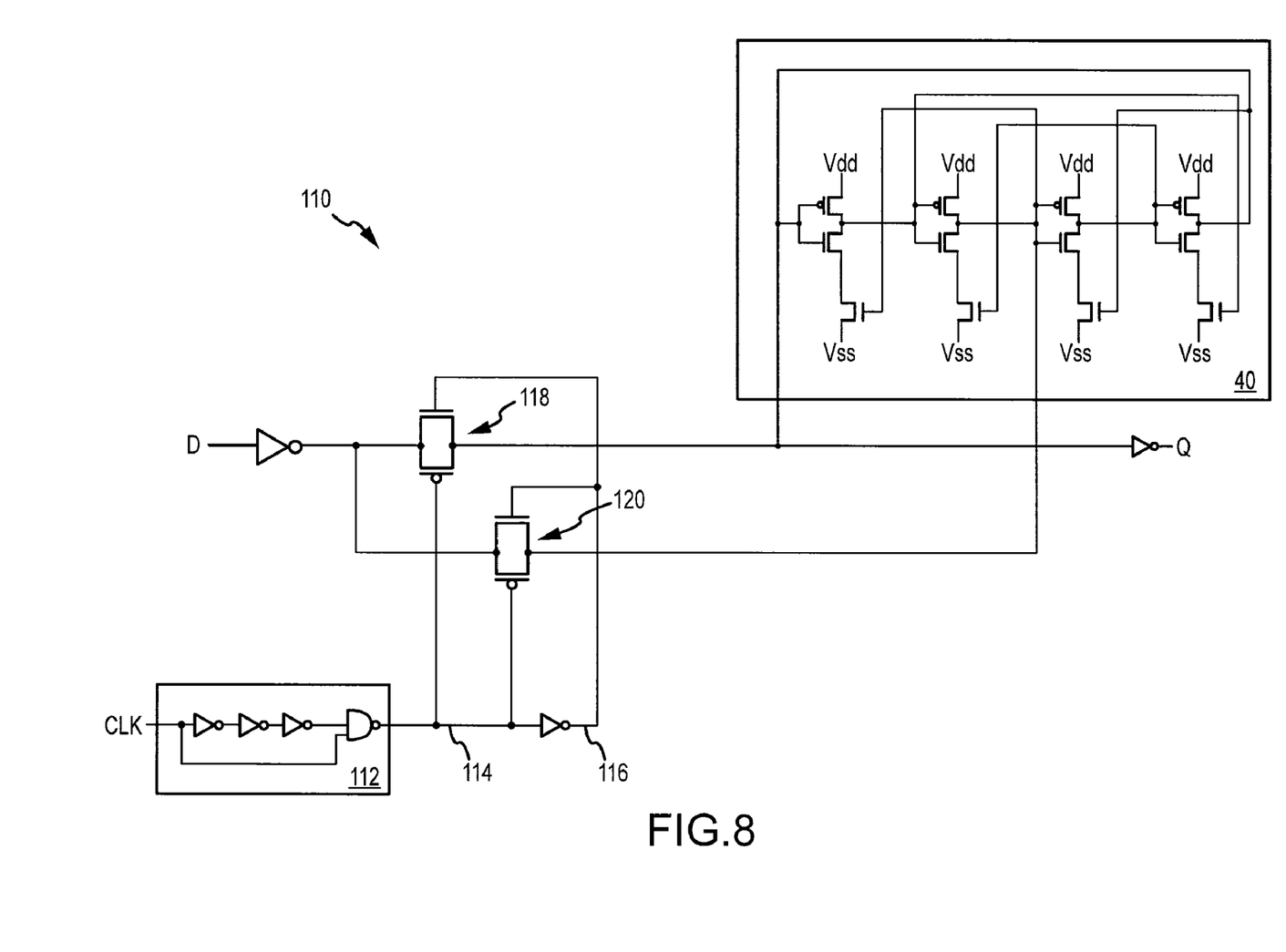
FIG. 8 depicts a circuit diagram of an alternative clocking circuit for a latch employing the soft error recoverable storage element of FIG. 4.

FIG. 8 depicts an alternative clocking design for a latch 110 employing the soft error recoverable storage element 40. The latch 110 employs a pulse shaping circuit 112 to control the shape of the clock signals 114, 116 driving the transmission gates 118, 120. The pulse shaper 112 provides clock pulses that may have widths of about three inverter delays. Such a circuit forms a high performance skew tolerant flip flop with a soft error recoverable storage element.

It should be understood that various embodiments may be employed in other sequential circuits to provide robust operation against soft errors. For example, a pipeline stage of a processor may employ soft-error recoverable flip-flops to protect against soft errors than might otherwise alter an instruction code. The storage element may be employed in flip-flop based designs as well as latch based designs to reduce soft errors caused by alpha and/or neutron particle hits.

Although embodiments of the present invention have been depicted using inverters implemented with CMOS transistors, this is by way of example and not limitation. Other embodiments may employ other types of inverting elements and/or may be implemented using other types of transistors, superconducting circuit elements, or any other technology capable of implementing digital logic. Further, while the present invention has been described in the context of specific embodiments and processes, such descriptions are by way of example and not limitation. Accordingly, the proper scope of the present invention is specified by the following claims and not by the preceding examples.

What is claimed is:

1. A storage element configured to recover from a soft error, comprising:
   a plurality of inverting elements configured in a loop, each inverting element having an input node and an output node, an output node of a first of the plurality of inverting elements operably coupled to an input node of a second inverting element in the loop, wherein each inverting element comprises:
      a first switching element operably coupled between a first voltage potential and the output node, the first switching element configured to drive the output node to a logic zero when the input node is a logic one; and
      a second switching element operably coupled between a second voltage potential and the output node and directly to the first switching element, the second switching element configured to drive the output node to a logic one when the input node is a logic zero; and
   a plurality of first gating elements, each first gating element of the plurality of first gating elements comprising a third switching operably coupled to one of the plurality of inverting elements, the third switching element operably coupled in series between the first switching element and the first voltage potential, and wherein the third switching element of each first gating element further includes a first control node directly coupled to the output node of the second inverting element in the loop such that when the first control node is at a logic zero value, the first gating element prevents the corresponding inverting element from being able to drive its output node to a logic zero state.

2. The storage element of claim 1, wherein the first switching element is a NMOS transistor, the second switching element is a PMOS transistor and the third switching element is a NMOS transistor.

3. The storage element of claim 1, wherein the plurality of inverting elements comprises four inverting elements.

4. The storage element of claim 1 further comprising:
   a data input configured to receive a data value;
   a data output operably coupled to an output of an inverter, the inverter having an input operably coupled to an input node of the first of the plurality of inverting elements;
   a clock input configured to receive a clock; and
   a second plurality of inverting transmission gates, each transmission gate operably coupled between the data input and an input node of one of the plurality of inverting elements, the second plurality of inverting transmission gates becoming transparent when the clock is asserted.

5. The storage element of claim 1 further comprising:
   a data input configured to receive a data value; and
   a push-pull differential write driver comprising:

a plurality of switching elements, each switching element operably coupled to the data input and an input node of one of the plurality of inverting elements and configured to become transparent when a write enable signal is asserted.

6. The storage element of claim 1, further comprising a plurality of second gating elements, each second gating element of the plurality of second gating elements operably coupled to one of the plurality of inverting elements, each second gating element further including a second control node operably coupled to the output node of the second inverting element in the loop such that when the second control node is at a logic one value, the second gating element prevents the corresponding inverting element from being able to drive its output node to a logic one state.

7. The storage element of claim 6, whereby the plurality of first gating elements and the plurality of second gating elements are operable to prevent a soft error from changing a logic state stored in the storage element.

8. A storage element configured to recover from a soft error, comprising:
   a first plurality of storage nodes, each storage node configured to store a data value;
   a feedback circuit operably coupled to the plurality of storage nodes and configured to prevent a soft error induced change in the data value stored in a first one of the plurality of storage nodes from propagating to a second one of the plurality of storage nodes and further configured to allow the first one of the plurality of storage nodes to recover from the soft error induced change in data value;
   a data input configured to receive a data value; and
   a push-pull differential write driver comprising:
      a second plurality of switching elements, each switching element operably coupled between the data input and an input node of one of the first plurality of storage nodes and configured to become transparent when a write enable signal is asserted.

9. The storage element of claim 8, wherein each storage node stores the same data value.

10. The storage element of claim 8, further comprising:
    a data input configured to receive a data value;
    a data output operably coupled to an output of an inverter, the inverter having an input operably coupled to an input node of a first one of the inverting elements of the first plurality of inverting elements;
    a clock input configured to receive a clock; and
    a first plurality of inverting transmission gates, each transmission gate operably coupled between the data input and an input node of one of the first plurality of storage nodes, the first plurality of inverting transmission gates becoming transparent when the clock is asserted.

11. The storage device of claim 8, wherein the feedback circuit comprises a second plurality of gating devices, each gating device operably coupled to a corresponding one of the first plurality of storage nodes, each gating device having a control node.

12. The storage device of claim 11, wherein the control node of each gating device of the plurality of gating devices is operably coupled to a second one of the first plurality of storage nodes.

13. A storage element configured to recover from a soft error, comprising:
    a first inverter comprising:
       a first input terminal;
       a first output terminal;
       a first switching element operable to drive the first output terminal to a logic zero when the first input terminal is a logic one; and
       a second switching element operable to drive the first output terminal to a logic one when the first input terminal is a logic zero;
    a second inverter comprising:
       a second input terminal operably connected to the first output terminal;
       a second output terminal;
       a third switching element operable to drive the second output terminal to a logic zero when the second input terminal is a logic one; and
       a fourth switching element operable to drive the second output terminal to a logic one when the second input terminal is a logic zero; and wherein the second storage node comprises:
    a third inverter comprising:
       a third input terminal operably connected to the second output terminal;
       a third output terminal;
       a fifth switching element operable to drive the third output terminal to a logic zero when the third input terminal is a logic one; and
       a sixth switching element operable to drive the third output terminal to a logic one when the third input terminal is a logic zero;
    a fourth inverter comprising:
       a fourth input terminal operably connected to the third output terminal;
       a fourth output terminal operably connected to the first input terminal;
       a seventh switching element operable to drive the fourth output terminal to a logic zero when the fourth input terminal is a logic one; and
       an eighth switching element operable to drive the fourth output terminal to a logic one when the fourth input terminal is a logic zero; and wherein a feedback circuit comprises:
          a first gating device operably connected to the first switching element, the first gating device including a first control node directly connected to the second output terminal and configured to prevent the first switch element from driving the first output terminal to a logic zero when the first control node is a logic zero;
          a second gating device operably connected to the third switching element, the second gating device including a second control node directly connected to the third output terminal and configured to prevent the third switching element from driving the second output terminal to a logic zero when the second control node is a logic zero;
          a third gating device operably connected to the fifth switching element, the third gating device including a third control node directly connected to the fourth output terminal and configured to prevent the fifth switching element from driving the third output terminal to a logic zero when the third control node is a logic zero; and
          a fourth gating device operably connected to the seventh switching element; the fourth gating device including a fourth control node directly connected to the first output terminal and configured to prevent the seventh switching element from driving the fourth output terminal to a logic zero when the fourth control node is a logic zero.

14. The storage element of claim 13, further comprising:

a fifth gating device operably connected to the second switching element, the fifth gating device including a fifth control node operably connected to the second output terminal and configured to prevent the second switching element from driving the first output terminal to a logic one when the fifth control node is a logic one;

a sixth gating device operably connected to the fourth switching element, the sixth gating device including a sixth control node operably connected to the third output terminal and configured to prevent the fourth switching element from driving the second output terminal to a logic one when the sixth control node is a logic one;

a seventh gating device operably connected to the sixth switching element, the seventh gating device including a seventh control node operably connected to the fourth output terminal and configured to prevent the sixth switching element from driving the third output terminal to a logic one when the sixth control node is a logic one; and an eighth gating device operably connected to the eighth switching element, the eighth gating device including an eighth control node operably connected to the first output terminal and configured to prevent the eighth switching element from driving the fourth output terminal to a logic one when the eighth control node is a logic one.

* * * * *